US008320393B2

(12) United States Patent
Atherton

(10) Patent No.: US 8,320,393 B2
(45) Date of Patent: Nov. 27, 2012

(54) SIGNALLING METHOD AND APPARATUS

(75) Inventor: Eric J. Atherton, Witney (GB)

(73) Assignee: Baker Hughes Incorporated, Houston, TX (US)

( * ) Notice: Subject to any disclaimer, the term of this patent is extended or adjusted under 35 U.S.C. 154(b) by 1299 days.

(21) Appl. No.: 10/578,463

(22) PCT Filed: Nov. 8, 2004

(86) PCT No.: PCT/GB2004/004712
§ 371 (c)(1),
(2), (4) Date: Apr. 9, 2008

(87) PCT Pub. No.: WO2005/048459
PCT Pub. Date: May 26, 2005

(65) Prior Publication Data
US 2008/0212691 A1    Sep. 4, 2008

(30) Foreign Application Priority Data
Nov. 7, 2003 (GB) .................................. 0326055.1

(51) Int. Cl.
*H04L 12/28* (2006.01)

(52) U.S. Cl. .................................... 370/419; 340/310.01
(58) Field of Classification Search .................. 370/320, 370/335, 342, 419, 441; 375/239, 257, 259, 375/340; 340/854.9, 310.01, 855.8, 538.11
See application file for complete search history.

(56) References Cited

U.S. PATENT DOCUMENTS

| 5,539,375 | A | 7/1996 | Atherton |
| 6,587,037 | B1 * | 7/2003 | Besser et al. ............... 340/854.9 |
| 7,248,178 | B2 * | 7/2007 | Layton ....................... 340/854.9 |

* cited by examiner

*Primary Examiner* — Robert Wilson
*Assistant Examiner* — Nourali Mansoury
(74) *Attorney, Agent, or Firm* — Cantor Colburn LLP

(57) ABSTRACT

An electrical signaling system is disclosed. A modulator is arranged to accept information and encode that information in an alternating signal containing repeated rising and falling edges, by way of the time between consecutive rising or consecutive falling edges. A transmission path transmits the signal from the modulator to a demodulator. The demodulator is arranged to detect a signal edge and store a record of the signal around that edge and compare a subsequent part of the signal with that record thereby to detect a like edge and detect the time difference between like edges.

29 Claims, 3 Drawing Sheets

SIGNALLING METHOD AND APPARATUS

FIELD OF THE INVENTION

The present invention relates to a signalling method and to apparatus for carrying it out.

BACKGROUND ART

Existing signalling methods used for the return of information from a downhole sensor, for example in the oil and gas extraction industries, rely on the transmission of signals along suitable conductors. These conductors must traverse the entire depth of the hole in which the transducer is located. There is significant cost associated with installing a downhole conductor, and therefore it is desirable to multiplex the downhole sensor signals along other conductors that are also present in the borehole.

It has previously been proposed to employ the three-phase conductors used for electrical supply to downhole motors that may be located in the wellbore. It is a characteristic of a balanced three-phase electrical supply that after passing through the load (such as a motor), the conductors can then be grounded at a neutral point. The neutral point will, in the absence of faults in the three-phase supply, exist at substantially zero volt, with respect to the surrounding earth or chassis potential. A mirror of the neutral point can then be constructed above ground through the use of three inductive loads, and in this way a conductive path can be created between the neutral point on the surface and of the downhole neutral point with the return signal going through the downhole casing or tubing in the wellbore. Signals can be sent around this conductive path.

However, if a fault should occur in the three-phase supply then the downhole neutral point would be exposed to significant voltages. Accordingly, a downhole inductor is commonly placed in series with the neutral point prior to connection to the signalling instrumentation. In association with a downhole capacitor, a low pass filter is created that limits the ingress of the high alternating voltages that power the downhole motor. This inductor and capacitor combination will tend to limit the speed at which the applied signal can be varied and hence the bandwidth of this transmission path. Typically, given the voltages involved in this context, an inductance will be required which will impose a minimum settle-time of the order of one second. That is, after an abrupt change in the applied voltage at the downhole neutral point, there will be a period of approximately one second during which the voltage at the surface neutral point will be unstable before it settles at the new voltage level. During this time the measured voltage at the surface neutral point will be highly variable as a result of the inductor.

Known signalling systems such as U.S. Pat. No. 5,539,375 use voltage or current levels to encode information, but these methods suffer from this long settling time caused by the above mentioned inductors in the signal path. In addition, electrical interference from the pump power can cause the current or voltage levels to be disturbed, degrading the signal quality if analogue encoding methods are used, or degrading the data transmission rate if digital encoding methods are used.

SUMMARY OF THE INVENTION

The present invention seeks to overcome this limitation and provide a signalling system that can cope with such an extremely low quality transmission path, provide a usable bandwidth, and substantially mitigate the effects of electrical interference.

It therefore provides an electrical signalling system comprising a modulator arranged to accept information and encode that information in an alternating signal containing repeated rising and falling edges, the encoding being by way of the time between consecutive rising or consecutive failing edges, a transmission path for the signal from modulator to a demodulator, where the demodulator is arranged to detect the signal edge and store a record of the signal around that edge and compare a subsequent part of the signal with that record thereby to detect a like edge and detect the time difference between like edges.

Such a system need not detect the precise position of the edge. What it detects is that an edge has occurred within a short time frame, and retains a record of features associated with the signal during that period. This record may be in the form of a digitised version of the signal. This record is compared with a subsequent part of the signal, and where the subsequent signal differs only minimally from the record (i.e. within specific tolerances of error), the system deems that a second like edge has occurred. Thus, although the precise position of the edge may or may not be detected by this system, the time delay between respective like edges is precisely detected. This yields the required information.

The transmission path can be imperfect, for example inductive, without impairing the efficiency of such a system, although this will place limits on the available bandwidth. The system is capable of sending recognisable signals along a three-phase electrical supply cable. In general, equipment attached to the cable will provide noise on top of the intended signal, but the system can cope with this by (for example) accepting the best correlation between the previous recorded signal and the current signal pattern.

The invention is particularly applicable to the supply of information from downhole sensors in the oil and gas extraction industries. These sensors must transmit the signals over a long transmission path, often using cables optimised for survival in the environment rather than for ideal electrical characteristics.

It is preferred that the demodulator also detects unlike edges and then detects the time difference therebetween. In this way, two signals can be transmitted simultaneously, one by the rising edges and one by the falling edges.

It is preferred if the alternating signal levels are constant. This ensures that each rising edge is identical to the next, and each falling edge is identical to the next. This greatly improves the ability to correlate the edge patterns accurately.

Multiple sources of data can be included consecutively by transmitting in a predetermined sequence. In this case, the start of the sequence can be determined by transmitting a unique pattern that will never be generated by any data set. An intermediate signal level can also be used to indicate the start of a sequence.

The data can be digitally encoded using "bins", i.e. a specific range of times that correspond to a specific value of the input information. For example, a specific output of the transducer could be coded as any signal between 410 and 414 ms. In this case, the system will seek to sends a 412 ms signal, and provided the error rate is less than 2 ms, preferably less than 1 ms, there will be no uncertainty in the received signal at the surface. The bins can all be of identical width, or can have a variable width such that the accuracy of the system is greatest in its usual working parameters.

A double binning arrangement can also be used. For example, if it is desired to send a value of (for example) 1057, a first signal could indicate that the information is in a range 1000-1999 and a second signal could specify 57 as opposed to 56 or 58. By adding the signals together, the intended output of 1057 is obtained. This can provide greater efficiency in the usage of bin sizes. It can be arranged that a digitised signal (as above) shows the coarse level (eg. 1000, 2000, 3000 etc.) followed by further signal (analogue or digital) for the fine resolution. This can be of great benefit. If for example the "noise" in the signal transmission system is 1 ms, and the time between edges varies from 1 second to 2 seconds, according to the measured signal, then a 0-10,000 psi measured value will be encoded in a 0 to 1000 ms second window, with 1 ms of noise. This would give a noise of 10 psi. However, if a coarse level is transmitted first that specifies the coarse range (0-999, 1000-1999 etc.), then a subsequent analogue signal need only span from 0-1000 psi and hence the overall noise would be 1 psi.

BRIEF DESCRIPTION OF THE DRAWINGS

An embodiment of the present invention will now be described by way of example, with reference to the accompanying figures in which.

DETAILED DESCRIPTION OF THE EMBODIMENTS

Figure 1:
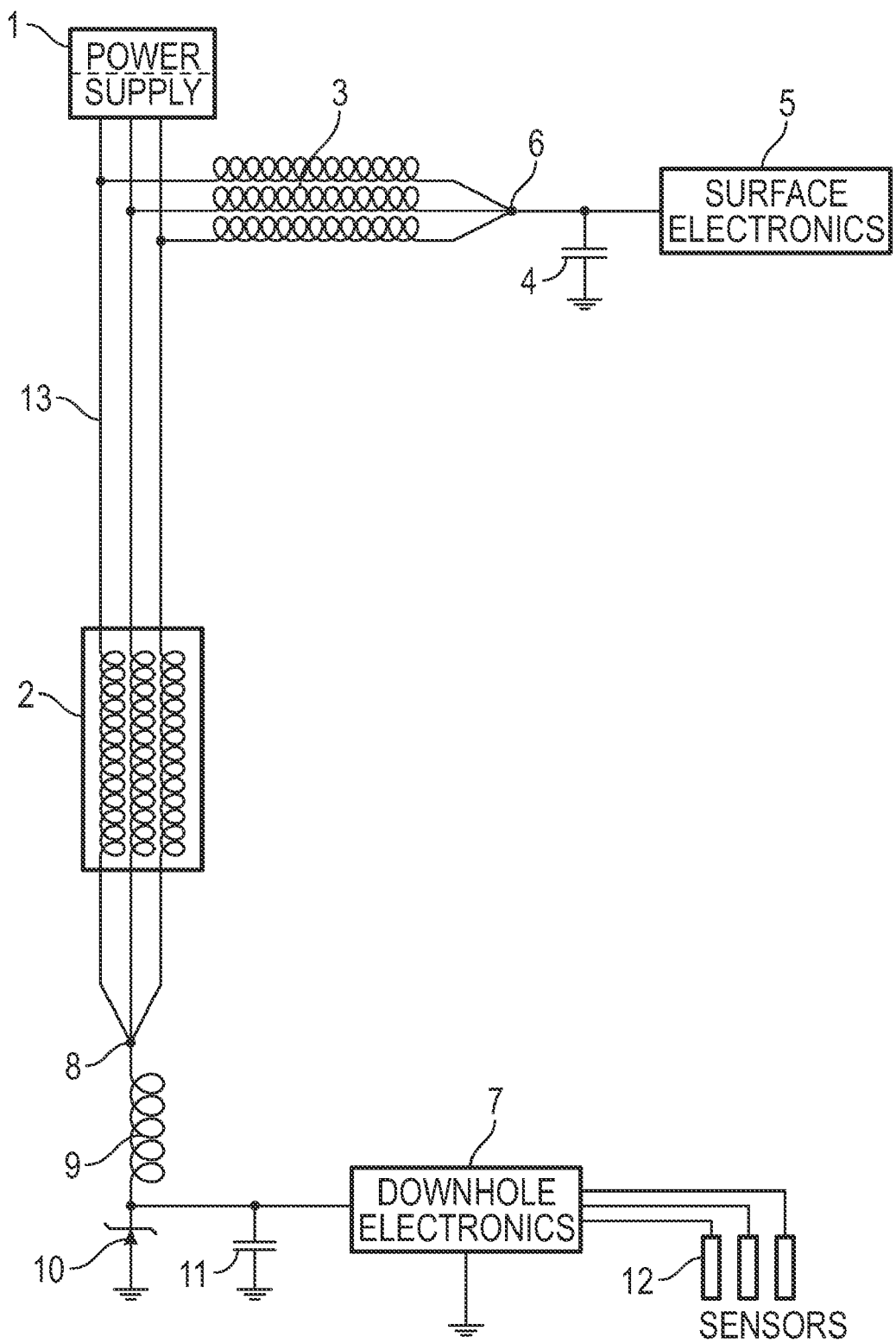
FIG. 1 shows a downhole instrumentation system.

FIG. 1 shows a downhole motor 2 connected via a downhole 3-phase power cable 13 to a surface isolated power supply 1. This system is used to assist the flow of oil up the well.

A downhole instrument, consisting of downhole electronics 7, sensors 12, capacitor 11, zener diode 10 and downhole inductor 9 is attached to the neutral point 8 of the downhole motor 2.

Surface electronics 5 are attached to surface neutral point 6 formed by joining the three surface inductors 3 together to make a neutral point 6. The surface inductors 3 are electrically connected to the downhole motor cable 13.

Hence, the downhole electronics 7 can communicate via inductor 9, motor 2, cable 13 and surface inductors 3 to the surface electronics 5, as described above.

The surface electronics 5 provide a steady direct current (DC) voltage, using well known methods and the downhole electronics 7 sink a controlled amount of current using equally well known methods, the amount of current being under the control of electronics 7. Variations in this current cause a variation in the current drawn from the surface electronics 5. Surface electronics 5 monitor this current.

Downhole electronics 7 is attached to sensors 12. The readings from these sensors 12 are digitised by electronics 7, which then encodes the readings by modulating the current, which is in turn sensed by surface electronics 5.

Figure 2:
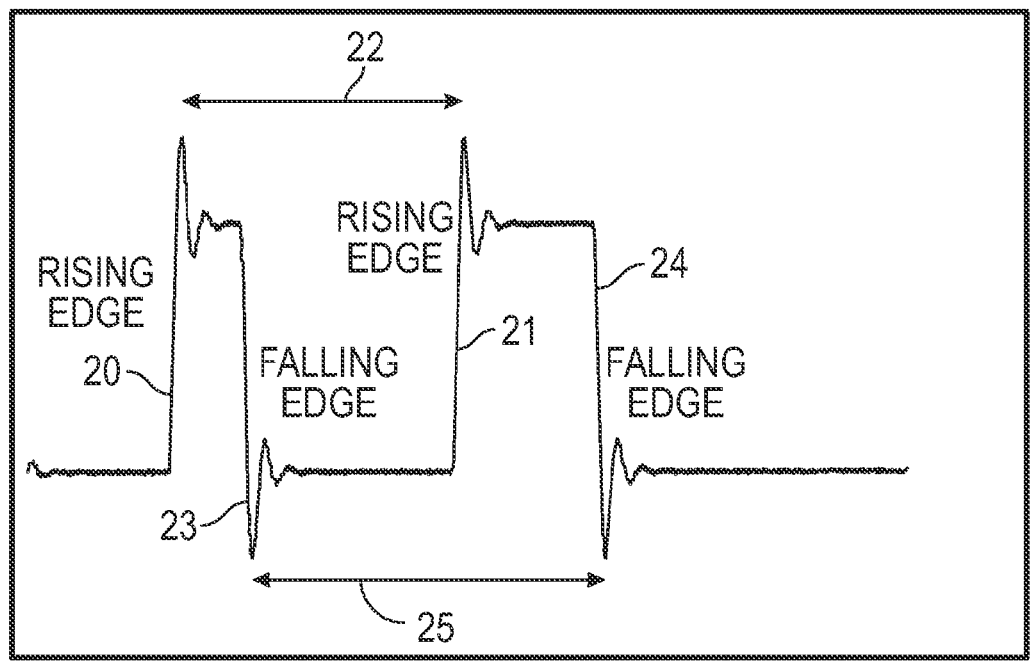
FIG. 2 shows the signal received from the instrumentation system.

A typical current signal received by the surface electronics 5 is shown in FIG. 2, in which rising edge 21 follows rising edge 20, by time interval 22. The reading from a first sensor 12 is encoded by varying time interval 22, in the range 1.5 seconds to 2.5 seconds. A zero signal from sensor 12 is thus encoded as a 1.5 second interval 22, and a full-scale signal from sensor 12 is encoded as a 2.5 second interval 22.

In a similar way, falling edge 24 follows falling edge 23 by a time interval 25. Time interval 25 can be used to encode information from a second sensor 12. It is important to choose the time intervals 22 and interval 25 ranges carefully, so that they allow adequate time for the edges to be recorded prior to the next edge, for any range of values for the sensors 12.

Figure 3:
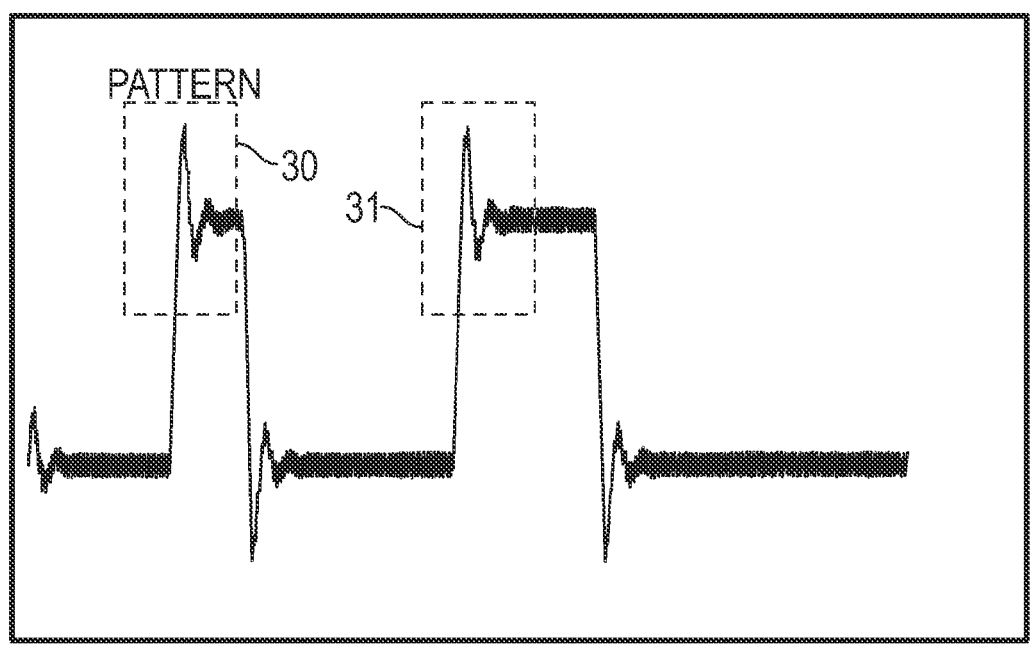
FIG. 3 shows the effect of noise on the signal.

FIG. 3 shows the influence of electrical noise on the received signal. The signal from the downhole electronics 7 has been degraded by noise picked up from the power supply 1 and motor 2.

The signal pattern close to the leading edge 20 is shown in pattern 30. The signal pattern close to the leading edge 21 is shown in pattern 31.

Figure 4:
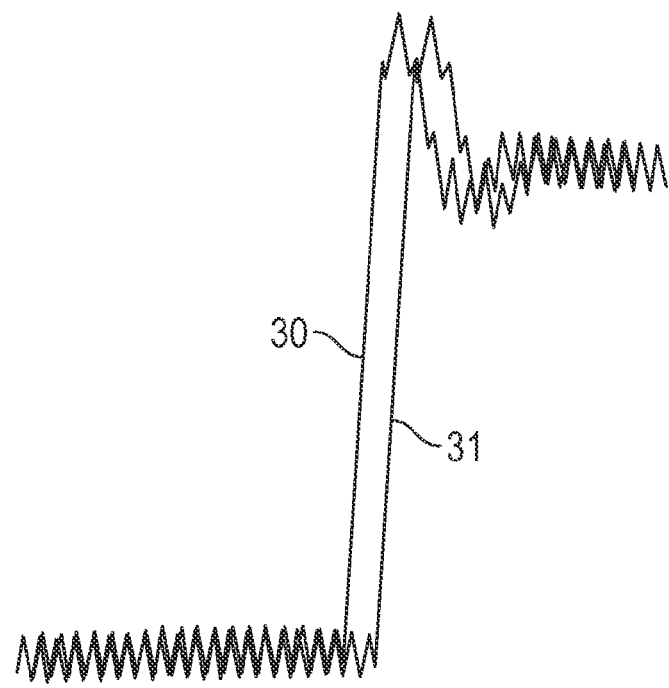
FIG. 4 illustrates the correlation process.

The surface electronics 5 digitises patterns 30 and 31 and attempts to digitally superimpose them, as shown in FIG. 4. FIG. 4 shows the situation when the superimposition is not quite correct. The electronics 5 adjusts the time interval 22 between the two patterns 30 and 31 until the best correlation is obtained. The correlation function used is to take the difference between the two patterns 30 and 31 at each digitised point, and then calculate the RMS value of these differences at all the digitised points. The surface electronics 5 then adjusts the interval 22 to minimise this RMS value. It will be understood that other suitable correlation functions may be used.

Figure 5:
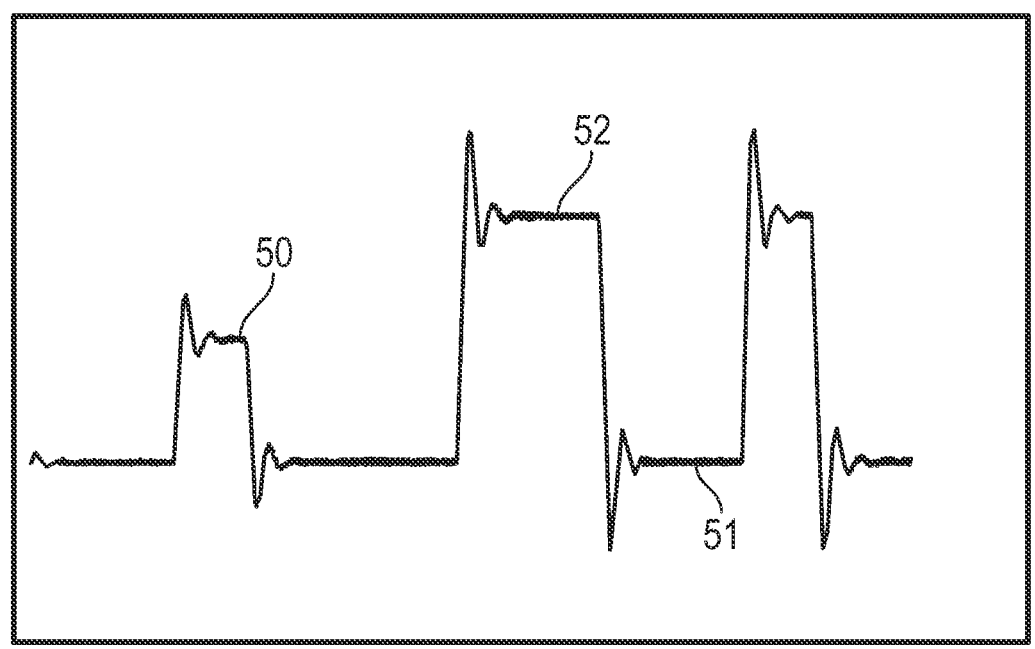
FIG. 5 shows a start-of-sequence pulse.

FIG. 5 shows the start of a sequence. Downhole electronics 7 uses two discrete current levels 51 and 52. This creates identical patterns 30 and 31 so that optimum correlation can be achieved from one edge to the next. A start sequence is indicated by an intermediate current level 50. Intermediate current level 50 is just used to indicate the start of a sequence, and is not used in the subsequent transmission of data.

One effect of the above system is that the total time required to transmit a complete record will be variable depending on the signal values. For example, if all the pressures being sensed are high, then the time intervals by which these are encoded will all be larger time intervals and the package of pressure measurements will take longer to transmit.

Whilst this is not a serious technical problem, it will sometimes be preferable for this to be avoided. One way of doing so is to encode alternate signals in different senses. Thus, the first signal would be encoded with a longer time interval corresponding to higher values. A subsequent signal would be encoded oppositely, i.e. with a longer time interval denoting a lower value. As the pressures, temperatures etc of sensors located proximate each other are likely to be similar, a higher local pressure, temperature etc will be encoded as long periods followed by short periods, etc. Likewise, a low local pressure (etc) will be encoded as short periods followed by long periods etc (or vice versa). In this way, the total time required is largely constant.

An alternative correlation function is to look at specific values of the signal at certain times. The selected time(s) can be chosen by reference to the signal value, for example the signal crossing one or more intermediate or other values, or signal peaks or troughs, or the patterns of peaks and troughs, or the like. To reach a correlation, the system can compare the signal values at specific times or compare the times at which specific signal values are detected.

It will of course be understood that many variations may be made to the above-described embodiment without departing from the scope of the present invention.

The invention claimed is:

1. An electrical signalling system, the electrical signalling system comprising:
   a modulator configured to produce an alternating signal comprising repeated rising and falling edges in which an information is encoded, the encoding being by way of a time difference between at least one of consecutive rising edges and consecutive falling edges; and
   a transmission path for the alternating signal from the modulator to a demodulator,
   wherein the demodulator is configured to detect the alternating signal, store a record of the alternating signal around a signal edge of the alternating signal, store a record of the alternating signal around a subsequent like signal edge, determine a difference between the record of the signal edge and the record of the subsequent like signal edge, and determine a time interval between the record of the signal edge and the record of the subsequent like signal edge that substantially minimizes the difference.

2. The electrical signalling system according to claim 1, wherein the record is in a form of a digitized version of the alternating signal.

3. The electrical signalling system according to claim 1, wherein the record of the signal edge is compared with the record of the subsequent signal edge to detect the time difference between the like signal edges.

4. The electrical signalling system according to claim 3, wherein the subsequent like signal edge is detected notwithstanding noise-induced differences between the signal edge and the subsequent like signal edge.

5. The electrical signalling system according to claim 4, wherein an error limit is measured by way of a root mean square ("rms") value of the time difference.

6. The electrical signalling system according to claim 5, wherein the rms value of the time difference is calculated for a range of possible time differences and a minimized time difference for which the rms value of the time difference is minimized is selected from the range of the possible time differences.

7. The electrical signalling system according to claim 1, wherein the transmission path further comprises an imperfect transmission path.

8. The electrical signalling system according to claim 1, wherein the transmission path further comprises an inductive transmission path.

9. The electrical signaling system according to claim 1, wherein the transmission path further comprises a three-phase electrical supply cable.

10. The electrical signalling system according to claim 9, wherein the three-phase electrical supply cable leads to downhole equipment for extraction of at least one of oil and gas.

11. The electrical signalling system according to claim 1, wherein the demodulator also detects unlike signal edges and then detects a second time difference therebetween.

12. The electrical signalling system according to claim 1, wherein the modulator is configured to include multiple sources of data consecutively.

13. The electrical signalling system according to claim 12, wherein the modulator includes (n+l) signals, including n signals of information to be encoded and a synchronization signal.

14. The electrical signalling system according to claim 13, wherein the synchronization signal takes a form of a unique pulse.

15. The electrical signalling system according to claim 14, wherein the unique pulse has a unique pulse size at most one of shorter and longer than limits of acceptable pulse size for encoded data.

16. The electrical signalling system according to claim 14, wherein the unique pulse is at a different signal level than the alternating signal conveying encoded information.

17. The electrical signalling system according to claim 1, data is encoded such that a specific range of pulse times corresponds to at least one of a specific value of input information and ranges of values of the input information.

18. The electrical signalling system according to claim 17, wherein the ranges of values of the input information are of substantially identical width.

19. The electrical signalling system according to claim 17, wherein the ranges of values of the input information are of variable width.

20. The electrical signalling system according to claim 1, wherein a first signal indicates a coarse range of values of input information and a second signal indicates at least one of a specific value of the input information within the coarse range of values and a fine range of values within the coarse range of values of the input information.

21. The electrical signalling system according to claim 20, wherein the first signal is encoded according to a different protocol than the second signal.

22. The electrical signalling system according to claim 1, wherein the record comprises at least one selected value of the alternating signal at at least one selected time.

23. The electrical signalling system according to claim 22, wherein the at least one selected value comprises a plurality of selected values and the at least one selected time comprises a plurality of selected times.

24. The electrical signalling system according to claim 22, wherein the at least one selected time is chosen by reference to an alternating signal value.

25. The electrical signalling system according to claim 24, wherein the at least one selected time is a time at which the alternating signal crosses a value intermediate values between which the alternating signal alternates.

26. The electrical signalling system according to claim 1, wherein the demodulator is arranged to compare a subsequent part of the alternating signal with the record by way of comparing alternating signal values at specific times.

27. The electrical signalling system according to claim 22, wherein the demodulator is arranged to compare the subsequent part of the alternating signal with the record by way of comparing times at which specific alternating signal values are detected.

28. A method of electrical signalling, the method of electrical signalling comprising:
   modulating using a modulator by:
      accepting information; and
      producing an alternating signal comprising repeated rising and falling edges in which the information is encoded, the encoding being by way of a time difference between at least one of consecutive rising edges and consecutive falling edges;
   transmitting the alternating signal over a transmission path from the modulator to a demodulator, and
   demodulating using the demodulator by:
      detecting the alternating signal;
      storing a record of the alternating signal around a signal edge;
      storing a record or the alternating signal around a subsequent like signal edge;

determine a difference between the record of the signal edge and the record of the subsequent like signal edge; and determine a time interval between the record of the signal edge and the record of the subsequent like signal edge that substantially minimizes the difference.

29. The method of electrical signaling of claim 28, wherein the record is in a form of a digitized version of the alternating signal.

* * * * *